United States Patent
Yamamoto et al.

(10) Patent No.: US 6,273,322 B1
(45) Date of Patent: Aug. 14, 2001

(54) PRODUCTIVE METHOD OF AMORPHOUS METAL-METAL JOINTED PARTS AND AMORPHOUS METAL-METAL JOINTED PARTS

(75) Inventors: Michiharu Yamamoto, Tokai; Yoshinobu Honkura, Aichi-ken; Kaneo Mouri, 3911-3, Shimadakuroishi, Tenpaku-cho, Tenpaku-ku, Nagoya-shi, Aichi-ken, 468-0027, all of (JP)

(73) Assignees: Aichi Steel Corporation, Tokai; Kaneo Mouri, Nagoya; Japan Science and Technology Corporation, Kawaguchi, all of (JP)

( * ) Notice: Subject to any disclaimer, the term of this patent is extended or adjusted under 35 U.S.C. 154(b) by 0 days.

(21) Appl. No.: 09/439,096

(22) Filed: Nov. 12, 1999

(30) Foreign Application Priority Data

May 12, 1999 (JP) .................................. 11-131977

(51) Int. Cl.[7] .............................. B23K 1/06; B23K 31/02; B23K 20/10; H01F 1/153
(52) U.S. Cl. ................................... 228/110.1; 228/180.5; 428/544
(58) Field of Search .................................. 228/1.1, 110.1, 228/4.5, 180.5, 122.1, 121, 123.1; 428/544

(56) References Cited

U.S. PATENT DOCUMENTS

| | | | |
|---|---|---|---|
| 4,472,652 | * | 9/1984 | Brice et al. ........................ 310/313 B |
| 5,330,097 | * | 7/1994 | Inoue ...................................... 228/194 |
| 5,332,695 | * | 7/1994 | Shigihara et al. .................... 437/209 |
| 5,492,263 | * | 2/1996 | Webster et al. ........................ 228/111 |
| 5,496,418 | * | 3/1996 | Ramanan et al. ...................... 148/304 |
| 5,821,627 | * | 10/1998 | Mori et al. ............................ 257/780 |
| 6,053,395 | * | 4/2000 | Sasaki ............................... 228/180.22 |

FOREIGN PATENT DOCUMENTS

360203379A * 10/1985 (JP) .
2-32077 7/1990 (JP) .

* cited by examiner

*Primary Examiner*—Tom Dunn
*Assistant Examiner*—Kiley Stoner
(74) *Attorney, Agent, or Firm*—Oblon, Spivak, McClelland, Maier & Neustadt, P.C.

(57) ABSTRACT

A production method for making a strong connection between an amorphous wire and a terminal. The amorphous wire is placed between the terminal and a bonding metal of aluminum or aluminum alloy, with the bonding metal in contact with both the amorphous metal and the terminal. Then, ultrasonic vibration is applied through the bonding metal to make the connection between the bonding metal and the terminal.

14 Claims, 4 Drawing Sheets

PRODUCTIVE METHOD OF AMORPHOUS METAL-METAL JOINTED PARTS AND AMORPHOUS METAL-METAL JOINTED PARTS

TECHNICAL FIELD OF THE INVENTION

The present invention relates to connections of the amorphous wire with terminal and their production method.

DESCRIPTION OF THE PRIOR ART

The MI effect of amorphous wire is a phenomena to show a large change of the impedance proportional to external magnetic field when a high frequency current is applied. Recently all MI sensor based on the MI effect has been watched with a keen interest. Because the MI sensor works with a small dimension the same as a hall sensor or MR sensor and never the less the small dimension it has a superior sensitivity to magnetic field 100 times larger than the MR sensor or hall sensor which are popular magnetic sensors. This sensitivity means to be as same as that of flux gate sensor.

An MI sensor consists of an amorphous wire for detecting magnetic field, a pickup coil bounding the amorphous wire and an electronic circuit for measuring a current running in the pickup coil. The amorphous wire used is made from cobalt alloy with a diameter of 20 $\mu$m to 130 $\mu$m. This amorphous wire has a recrystallization temperature of about 500° C. If the recrystallization occurs, MI effect of the amorphous wire drastically decreases. Therefore the soldering temperature must be kept below 300° C.

As is well known, the amorphous wires are stronger than piano wire. 60% Sn-40% Pb solder is not mixed with cobalt alloy of the amorphous wire. After soldering, the contact with 60% Sn-40% Pb solder and the amorphous wire shows appears to be only mechanical and not chemical.

As usual the amorphous wire is soldered according to the following procedures. At first the oxide film on the surface is removed by polishing it with emery paper. Then contamination on the surface is removed by flax. After that, sufficient mass of molten solder alloy is placed on the terminals produced on the substrate. These terminals are made from copper. The amorphous wire is inserted into the molten solder and the solder is then harden by cooling. In this manner, the amorphous wire is connected electrically with the terminals.

Another way to connect the amorphous wire with the terminal is a resistance welding method in which electricity is turned on while the amorphous wire is pressed to the terminal under some pressure after the wire is in contact with electrode.

Moreover, Japanese Examined Patent Application Publication (koukai) No.2-32077 discloses a method to connect the amorphous wire with the terminal using ultrasonic vibration. In the method, the amorphous wire is placed on the terminal and then ultrasonic vibration produced by the ultrasonic machine is loaded under some pressure.

THE PROBLEMS TO BE SOLVED BY THE INVENTION

However the above methods can not make a good contact between the amorphous wire and the terminal because the Co alloy type amorphous wire has a poor wettability in soldering metal. When soldering with them, the solder would be repelled from the amorphous wire by a surface force of melting solder. In fact the observation of the boundary with them is shown in FIG. 9 in which the solder contacts partially to there is a amorphous wire and the lack of the solder remaing on the wire.

The MI sensor having the above poor contact can not pass a heat cycle test in which the test samples undergo heat shock from −40° C. to +80° C. with repeated numbers of 100 in oil bath. Although many trials to solve this problems has been made so far, they have not come to success.

The MI sensor needs two coils wound around the amorphous wire for improving the linearity or extending the measuring range. But the coils are wound not directly to the amorphous wire because the amorphous wire is too fine in the diameter of 30 $\mu$m to 120 $\mu$m. They are inevitably offered as hollow coils so that assembly with the amorphous wire and the coils is so weak to vibration or shock. That means that this kind of MI sensor could not apply to automobile use which requires a strong structure to mechanical vibration or heat shock.

The above resistance welding method meets with a problem that the amorphous state changes to a crystal structure when subjected to the heat of welding. The soldering method can give only a poor mechanical contact because the solder would be repealed from the amorphous wire by a surface force of molten solder on soldering. The amorphous wire has only a poor wettability to the molten solder.

Moreover it is difficult for the above ultrasonic vibration method to make a good connection of the amorphous wire with the terminal. The reason is that the round wire placed on the terminal has a point contact, which can not easily form a strong connection. Although the present inventors made many trials using this method, they could not pass a heat cycle test or environment tests for automobile.

The amorphous wire is so hard and poor in elasticity that it is easily broken by mechanical vibration brought with ultrasonic energy. When the ultrasonic vibration method applies to a fine amorphous wire, this problem happens very often.

The purpose of the present invention is to offer solutions of the above problems. A connection of the amorphous wire with the terminal which is made through the present invention possesses a good mechanical strength and the amorphous state to suppress crystallization. Also their production method is offered in the present invention.

SUMMARY OF THE INVENTION

The present invention recited in claim 1 is a method to connect the amorphous metal with the terminal using a mass of soft bonding metal in which the amorphous metal is sandwiched between the terminal and the mass of the soft bonding metal. A bonding energy is supplied on the mass of soft bonding metal.

Soft bonding metals used should be aluminum, gold, solder and so on. The amorphous metal coated with the soft bonding metal can be used in stead of the mass of the soft bonding metal. In this case it is better that a mass of soft bonding metal can be applied on the coated amorphous metal in bonding. A reason is that the long time is needed to produce a thick enough coating layer of the bonding metal by the coating, CVD method and PVD method.

In this way the head of a bonding tool is not contacted with the amorphous metal which is so hard and very brittle and the bonding energy is not directly transferred to the amorphous metal. The bonding energy is transferred through the soft bonding metal so that the amorphous metal is protected with a buffer effect of the soft bonding metal. As a result the amorphous metal does not meet with any trouble, and is not broken, or not bent by the bonding energy.

In other words, the direct contact of the hard bonding tool to the hard and brittle amorphous metal is apt to bring about a problem to break or deform the metal. The buffer effect of soft bonding metal placed between the bonding tool and the amorphous metal can solve this problem.

The present method can transfer the bonding energy to the amorphous metal and the terminal more effectively than the method to contact the tool to the amorphous metal. Because the contact area with the amorphous metal and the soft bonding metal becomes large and the powerful bonding energy is transferred to the amorphous metal. Then its energy is transferred to the terminal through the amorphous metal and can make a good connection with the amorphous metal and the terminal.

In the present method only a little stress, is given to the amorphous metal compared with the conventional soldering method. Because solidification from the molten solder is accompanied with shrinkage of the volume and the shrinkage cause the internal stress in the amorphous metal.

The present invention recited in claim 2 is a method with the usage of ultrasonic bonding.

In the present method the ultrasonic vibration under some pressure generates heat only on the boundaries among the soft bonding metal, the amorphous metal and the terminal. The vibration inevitably makes the boundaries clean due to ultrasonic friction. The heat melts the soft bonding metal and forms the connection through the clean surface. The heat generates only on the boundaries not to raise the temperature of the amorphous metal. The bonding alloy on the boundaries is melted by the heat. The place of melting the the bonding alloy is at first only on the contact top of the amorphous metal with the alloy and is extended gradually to the whole surface of the amorphous metal and finally to the whole boundaries of the amorphous metal and the terminal.

The heat is generated by ultrasonic friction, but the temperature of the amorphous metal is kept to be at low temperature not to lead the crystallization of the amorphous metal, because the heat is smoothly conducted by the bonding alloy as well as the terminal. As well known, the soft magnetic property of the amorphous metal decreases remarkably after heating over the crystallization temperature.

The head of an ultrasonic bonding tool is not contacted to the hard and brittle amorphous metal. The ultrasonic bonding energy is not directly transferred to the amorphous metal. It is transferred through the soft bonding metal and the amorphous metal is protected with a buffer effect of the soft bonding metal. As a result the amorphous metal is not broken, or not bent by the ultrasonic bonding energy. Moreover the amorphous metal does not heat up to a high temperature, because the ultrasonic friction of the soft bonding metal with the hard amorphous metal as well as the hard ultrasonic bonding tool do not generate a lot of heat.

The present invention recited in claim 3 is a method as same with the usage of ultrasonic bonding through the soft bonding metal with the thickness of more than 30 $\mu$m. In the case of the soft bonding metal with a lower thickness, the buffer effect is not sufficient. After ultrasonic bonding, the connection is apt to show less mechanical strength because of existence of a too thin part of the bonding metal.

The present invention recited in claim 4 is a method using an amorphous wire in stead of the amorphous metal. The amorphous wire can have a near round cross-section so that the contact area with the amorphous wire and the ultrasonic bonding tool is small. If they are contacted directly, the ultrasonic bonding energy concentrates the small contact area. That tends to leave the amorphous wire broken out, cracked and bent. At the same time the contact area of the amorphous wire with the terminal also becomes small, so the strength of the connection becomes weak or insufficient. On the contrary, the amorphous wire in the present method is contacted through the soft bonding metal to the ultrasonic bonding tool. The ultrasonic bonding energy is transferred to the amorphous wire through the bonding metal which has an ability to deform easily. The present method is a solution for the difficult problem accompanied with bonding the the amorphous wire.

The present invention recited in claim 5 is a method where the strong and wide connection with the terminal and the soft bonding metal is requested. The soft bonding metal is bonded to the terminal as well as the amorphous wire. The connection with the amorphous wire and the terminal becomes wide and strong by the connection of the soft bonding metal with both of the amorphous wire and the terminal. It is natural that the strong and wide connection improves the shock resistance. Also it decreases the electric resistance because the bonding metal becomes the passage for electric current. The decrease of electric resistance is useful for decreasing the noise of and MI sensor.

The present invention recited in claim 6 is a method both sides of the amorphous wire are contacted to the terminals by the soft bonding metal. The arrangement among them leads to more excellent connection of the amorphous wire with the terminal. The connection can improve the shock resistance still more.

The present invention recited in claim 7 is a method where the soft bonding metal is placed on the side edges of the amorphous wire and the terminal. Both edges of the amorphous wire are fully covered by the bonding metal and the connections offer the maximum strength and an improved corrosion resistance.

The present invention recited in claim 8 is a method where the second bonding metal to have a better affinity of the amorphous wire than that of the terminal metal is placed between the amorphous wire and the terminal. This second bonding metal can be selected from gold, aluminum, solder and so on. The present method can improve the strength of the connection with the amorphous wire and the terminal still more.

The second bonding metal placed on the terminal can be produced separately from the amorphous wire and the terminal or can be deposited on the amorphous wire or the terminal with coating, CVD, PVD and so on.

In the case of the amorphous wire coated by the second bonding metal, the bonding metal is placed between the head of the ultrasonic bonding tool and the amorphous wire can be omitted partially or fully.

Moreover the second bonding metal placed between the amorphous wire and the terminal may consist of double or several layers. The second bonding metal of the near side to the amorphous wire should have good affinity for the amorphous wire. On the contrary, the third bonding metal of the near side to the terminal should have good affinity for the terminal metal.

The present invention recited in claim 9 is a method where aluminum or aluminum alloy is applied for the bonding metal.

The present inventors found that applying aluminum or aluminum alloy as the bonding metal made a excellent connection with the terminal and the amorphous metal compared to other metals in strength and electric resistance. Especially the effect of aluminum or aluminum alloy worked effectively in the case of amorphous wires made from FeSiB alloy and FeCoSiB alloy.

So far there have been not good techniques to connect the amorphous wire with the terminal. Soldering method-can not make a good connection because of the bad wettability of molten solder to the amorphous wire. Electric resistance welding also damages the magnetic property of the amorphous wire because of raising the temperature. When solder is selected as the bonding metal instead of aluminum or aluminum alloy, ultrasonic bonding melts solder too much due to the low melting temperature. In this situation, it is difficult for ultrasonic vibration to transfer from the ultrasonic bonding tool to the amorphous wire. In the case that other metals softer than aluminum or aluminum alloy, such as gold and silver, are selected as the bonding metal, their connection shows a low strength.

The present inventors believe that the excellent effect of aluminum used for the bonding metal would contribute to a to reduction in power. The abrasion caused by ultrasonic vibration breaks the oxide films on the surfaces of the terminal and the amorphous wire as well as aluminum. Their fresh surfaces bring good and strong connections easily. The reduction in power of aluminum protects the fresh surfaces against oxidization and keeps their fresh surfaces during vibration. Aluminum oxidizes instead of the amorphous wire and the aluminum oxide formed would disperse into the aluminum because it is a soft metal. Moreover the chemical affinity of aluminum to FeSiB alloy and FeCoSiB alloy of the amorphous wire would strengthen the effect of aluminum. It means that an alloy mixed with both metals can be formed on the contact surface easily.

Even in the case of using aluminum as the bonding metal, it is noticed that the heat is generated by friction but does not raise the temperature of the amorphous wire over the glass temperature of the amorphous wire. The heat can not melt aluminum or aluminum alloy because the melting temperature of aluminum or aluminum alloy far is higher than that of solder. During ultrasonic bonding, aluminum or aluminum alloy remains in solid state so that the ultrasonic energy can be transferred to the amorphous wire and the terminal. At the same time they have good deformation ability, so they can deform easily to cover the amorphous wire and make a contact to the surface of the terminal. Finally good connection of the amorphous wire with the terminal through aluminum or aluminum alloy is made.

The present invention recited in claim 10 is a method where the surface of the amorphous metal is etched to remove the oxide film or stain on it before ultrasonic bonding. Usually the amorphous metal has thick oxide film due to rapid quenching process from high temperature. It is difficult to connect or bond the amorphous metal having a thick oxide film with other metals. The etching treatment changes the surface activity and can make a good connection surely.

The connection of the amorphous wire of the terminal disclosed in claim 11 is made by using aluminum or aluminum alloy as the bonding metal. The bonding metal is bonded with the terminal as well as the amorphous wire. This type of the connection is made by the production method recited in claim 8.

This connection has better shock resistance. It also decreases the electric resistance because the bonding metal makes a electric connection between the amorphous wire and the terminal. The decrease of the electric resistance brings improvement of the sensitivity of an MI sensor proportionally.

Claim 12 recites discloses that the connections of the amorphous wire of the terminal using the bonding metal on both sides of the amorphous wire, as a matter of course, can improve shock resistance still more.

Claim 13 recited that if the thin film of the second bonding metal is inserted between the amorphous wire and the terminal, the connection of the amorphous metal with a terminal has more strength. Here the above second bonding metal must have good affinity to both of the terminal metal and the amorphous wire. They should be selected from aluminum, gold, solder and so on.

This film can be deposited on the surface of the amorphous wire or the terminal by the deposition methods such as coating, CVD and PVD. These films are useful to make a good connection in spite of thin films.

Claim 14 discloses that the amorphous wire connected with the terminal is used for a detector of magneto-impedance (MI) sensor It is desirable that the detector has electric resistance as low as possible to get high sensitivity of the MI sensor.

The bonding metal forms a wide electric passage from the amorphous wire to the terminal and it decreases the electric resistance of the wiring which gives no effect on detecting the magnetic field. The decrease of the electric resistance of the wiring improves the sensitivity of the MI sensor.

NAME OF THE PART ACCORDING TO THE REFERENCE NUMERALS IN THE DRAWING

Figure 1:
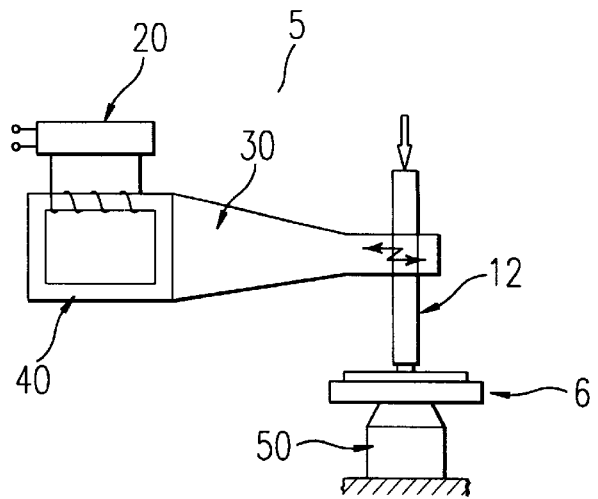
FIG. 1 is a graph showing the ultrasonic bonding machine with which example 1 was made.

5: a ultra sonic bonding machine 6: a test piece
12: a bonding tool 20: an oscillator 30: a cone
40: a ultrasonic oscillator 50: an anvil 60: an amorphous wire
65: an aluminum wire
70: a substrate with terminals 71: an opening 72: an aluminum coating 74: a nickel coating 76: a copper foil
78: an epoxy substrate 79: terminals
80: a connection
1b a silicon IC tip 2b: a terminal
3b: an amorphous wire 4b: a bonding alloy 5b: a ultrasonic bonding tool 11b: a silicon substrate 12b: an insulator
2e: a substrate 21e: a conductor 4e: molten solder 11e an amorphous wire

DESCRIPTION OF THE PREFERRED EMBODIMENTS

Many investigations of the inventors resulted that the ultrasonic bonding could make a good connection of the amorphous metal with the terminal when the bonding metal is put on the amorphous metal. Here the ultrasonic bonding energy was supplied from the bonding tool to the amorphous metal through the bonding metal. This result led the present invention to come true.

In other words the present bonding method is characterized by a connection of the amorphous metal with metal which is made by ultrasonic vibration using the bonding metal interposed between them.

The present bonding method can connect the amorphous metal with other metal surely. The reason is that the ultrasonic vibration makes the surface of the amorphous metal active and the surface has good wettability to the bonding metal.

In the present bonding method the amorphous metal is connected with other metals by ultrasonic vibration using the bonding metal interposed between them.

The amorphous metal is defined as a metal which has no crystaline constituent elements, as like a glass state. The amorphous metal possesses many good properties such as a magnetic property, corrosion resistance and wear resistance. The typical kinds of amorphous metal are FeSiB alloy, FeCoSiB alloy and so on. Any shape of the amorphous metal, like sheet or wire is used in the present invention but a wire shape with the diameter of less than 100 $\mu$m is suitable.

The bonding metal is a metal for connecting the amorphous metal with the terminal. A reducing metal such as aluminum, aluminum alloy and zinc is desirable for this bonding metal.

The terminal is made from metal having a good electric conductivity such as copper but if necessary it can take amorphous metals or any other metals. It is preferable that the surface of the terminal is coated by the same reducing metal as the bonding metal. Here the coating, CVD, PVD and metal spray method are applied for the coating method.

The bonding metal which works as interposition is directly contacted to the amorphous metal and the terminal. The set positions of the bonding metal are between the amorphous metal and the terminal or on the amorphous metal placed on the terminal.

The ultrasonic vibration makes vibrating motion between the bonding metal, the amorphous metal and the terminal and connects them together. Here the ultrasonic vibration is generated by a conventional type of the ultrasonic oscillator machine.

The preferable arrangement of the present ultrasonic bonding is that the amorphous wire, the bonding metal and the head of the ultrasonic bonding tool are placed on the terminal in above order and the ultrasonic vibration is supplied from the head of the ultrasonic bonding tool under some pressure.

The contact surface with the amorphous and the bonding metal is vibrated by the ultrasonic vibration which is generated in the ultrasonic vibration machine. The friction heat is generated on the contact surface by the ultrasonic vibration and it makes a connection with them. Here the heat is generated only near the contact surface. The vibrating abrasion breaks the oxide films on the surfaces of the terminal and the amorphous metal and makes fresh surfaces to join the bonding metal easily based on the cohesion power.

The amorphous wire is bent or broken easily on applying ultrasonic vibration directly because it is too fine in diameter. The problem can be solved by using the bonding metal which is placed between the amorphous wire and the ultrasonic head. The ultrasonic vibration is loaded on the bonding metal and the bonding metal works as a buffer. This buffer protects the amorphous wire against the rupture or bending during vibration.

When using the bonding metal the amorphous wire, the bonding metal and the terminal are each contacted together, so that the amorphous wire is fixed or connected strongly and surely.

When the amorphous wire is surrounded wholly with the bonding metal to have enough contact area, the connection with them shows large strength.

The present bonding metal plays another role like a heat sink which absorbs the friction heat generated by the ultrasonic vibration. Aluminum used for the bonding metal has high ratio of heat conduction and absorbs the friction heat, which produces almost no increase in temperature of the amorphous metal.

The vibrating abrasion removes the oxide film on the surfaces of the amorphous metal to make them fresh. Oxidizing the fresh surface again is prevented by aluminum which has the high reducing power. In fact the amorphous wires made from FeCoSiB alloy are bonded using the bonding metal such as aluminum, gold, silver, copper and so on. The connection with aluminum showed the highest result in many endurance tests among that with some other metals.

By the way the present method can apply to the case for producing the connection of micro parts on an electric circuit with the amorphous wire.

Embodiment (1)

The following embodiments explain the present invention about the connection of the amorphous metal concretely.

Figure 2:
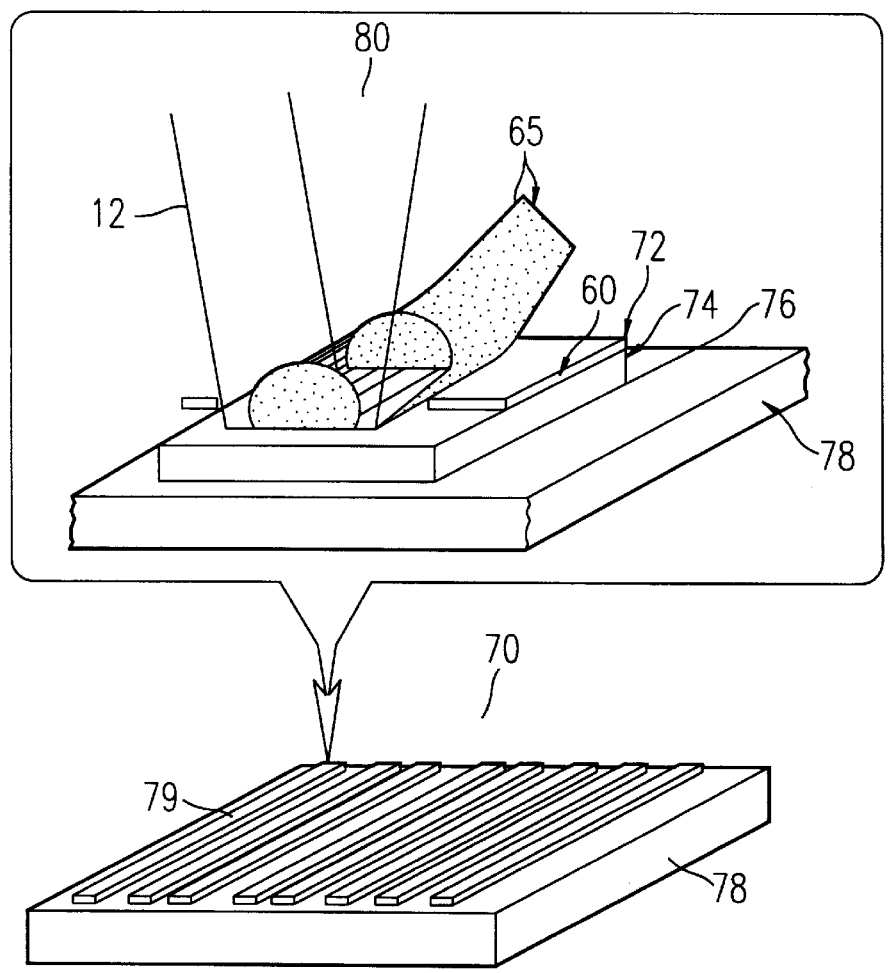
FIG. 2 is a graph showing the connect with the amorphous wire and the terminal of example 1.

The embodiment was produced using the ultrasonic vibration machine as shown in FIG. 2.

In FIG. 1, 6 is a test piece, 12 is a bonding tool, 20 is an oscillator, 30 is a cone, 40 means an ultrasonic oscillator and 50 is an anvil.

First the amorphous metal which had a composition of FeCoSiB and a diameter of 30 $\mu$m was used. The epoxy substrate used was a square with length of 50 mm and thickness of 0.5 mm and a copper film of 0.03 mm thickness was pasted on the substrate. The terminals were produced on the substrate by etching and the terminals were square of 0.5 mm length and were placed in distance of 3 mm from a neighboring terminal. After that non electric nickel coating of 3 $\mu$m thick was formed on the terminal and aluminum was deposited to be 3 $\mu$m thick on the nickel coating. In this way the substrate with plural terminals was produced.

Figure 3:
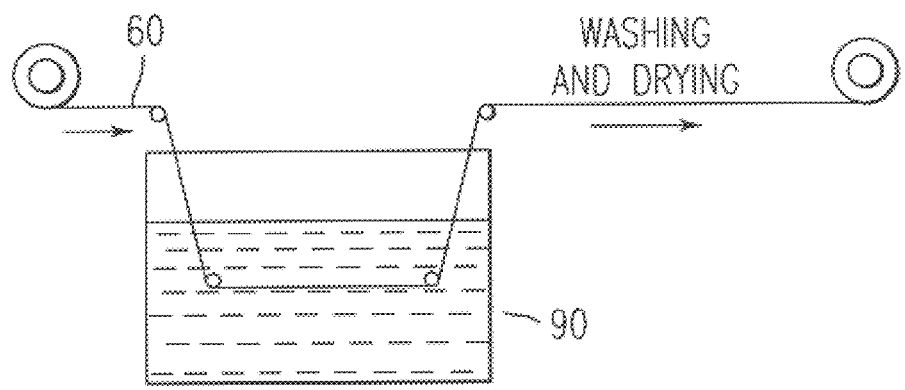
FIG. 3 is a graph showing a washing apparatus in which the surface of example 1 was washed

The amorphous wire 60 was washed with alkaline solution 90 to remove grease and subsequently it was washed with water followed by drying as shown in FIG. 3.

Next the amorphous wire was placed on the plural terminals of the substrate and the aluminum wire of 300 $\mu$m diameter as the bonding metal was piled up on the amorphous wire.

Then the head of the ultrasonic bonding tool was put on the aluminum wire and the ultrasonic vibration was supplied to the aluminum wire, the amorphous wire and terminals from the head to make connections of the amorphous wire with the terminals. Here the power of the ultrasonic bonding head was 4 watts, the time during vibration was 0.7 second, the frequency of the vibration was 60 kHz and the load was 200 g.

After bonding, the majority of aluminum was consumed for making connections, but the surplus of aluminum remained inevitably was removed from the connections by cutting.

Ultrasonic vibration was applied within conditions with the power of 1 watt to 10 watts, the vibration time of 0.1 second to 1.5 seconds, the frequency of 60kHz and the load of 100 g to 2000 g. It is a matter of course that the present invention is not restricted with the above conditions.

Figure 4:
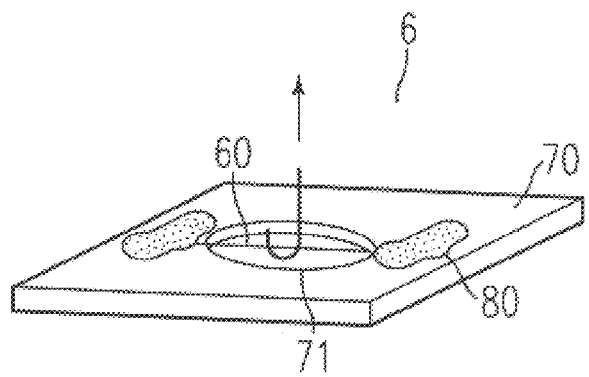
FIG. 4 is a graph showing a tensile machine by which the strength of example 1 was measured.

As shown in FIG. 4, the test piece was produced to take consideration to the above method.

The test pieces were made from the substrate. They had an opening with diameter of 10 mm on the center of the square piece of 30 mm length. The amorphous wire was placed across the opening on the substrate with length of 20 mm and both edges of the amorphous wire were connected with terminals by the present method. Five test pieces produced in this way were tested.

Comparative Examples

Comparative examples were made in same condition as the present method except that an other metal as the bonding metal was used instead of aluminum. Five test pieces for comparative examples were tested.

Tensile Test

The strength of the connections was tested in tensile test with 10 test pieces. Here the amorphous wire was pulled vertically on the center by a hook until the wire was broken or the connection with the amorphous wire and the terminal was broken or peeled. The maximum load was the estimation parameter for the strength of the connection. The results were shown in table 1.

TABLE 1

| | tensile load | mode of breakage | remarks |
|---|---|---|---|
| examples | | ultrasonic bonding with aluminum | |
| 1 | 232 | broken on the center of the wire | |
| 2 | 242 | broken on the center of the wire | |
| 3 | 239 | broken on the center of the wire | |
| 4 | 220 | broken on the center of the wire | |
| 5 | 230 | broken on the center of the wire | |
| average | 232.6 | | |
| comparative examples | | ultrasonic bonding without aluminum | |
| 1 | — | (broken on binding) | no tensile test |
| 2 | 58 | peeling of the wire from connection | |
| 3 | — | (broken on bonding) | no tensile test |
| 4 | — | (broken on bonding) | no tensile test |
| 5 | 54 | peeling of the wire from connection | |
| average | — | | |

It is seen from table 1 that the test pieces for the present examples showed the breakage of the center of the amorphous wire and the breakage load with the average of 232.6 g accompanied with the maximum of 242 g and the minimum of 220 g.

The comparative test pieces of No. 1, No. 3 and No. 4 for comparative examples showed the breakage of the connections when bonding and No. 2 and No. 5 showed the good connection when bonding but the amorphous wire was peeled from the connection on tensile test. At this time tensile load of No. 2 showed 58 g and that of No. 5 showed 54 g. The average for the present examples was far higher than comparative one, which means the present invention offers a good connection with them.

Figure 5:
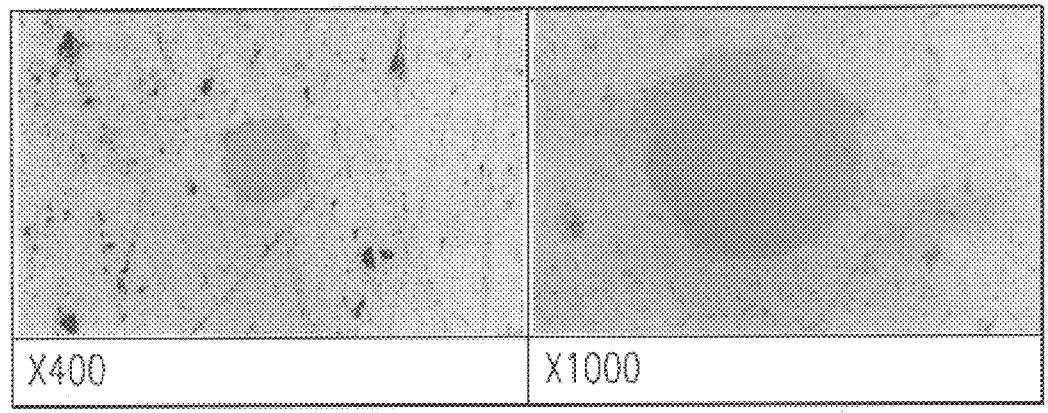
FIG. 5 is a photograph showing the microstructure of the cross-section around the connection of the amorphous wire for example 1.

For reference, FIG. 5 shows a photograph of the cross-section around the connection of the amorphous wire for example 1. It is seen that the amorphous wire is surrounded wholly with the aluminum to become a unity.

Other Example

As follows were modifications of the present example.

The amorphous wire was etched in FeCl3 acids and then washed and dried before bonding. The etching was done in solution with specific gravity of 48 Be in Baume's degree at the temperature of 20° C. for pickling time of 1 minute.

The oxide film or stains on the surface of the amorphous wire were removed through etching and the fresh surface made better connection in strength.

Moreover after etching, if the amorphous wire was washed with deoxygenated water and dried to be kept under a non-oxygen atmosphere before bonding, the better connection was obtained. Bonding under a non-oxygen atmosphere offered still more excellent connection.

Embodiment (2)

Figure 6:
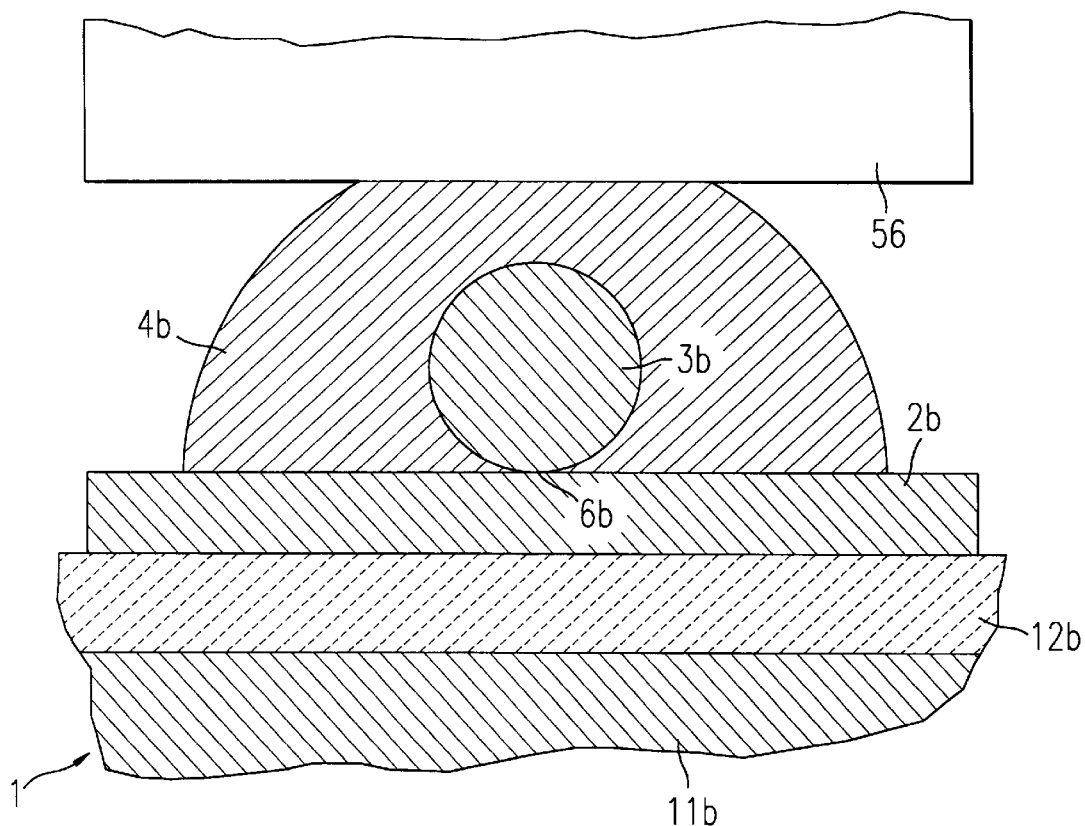
FIG. 6 is a graph showing the cross-section of the connect with the amorphous wire and the terminal for MI sensor of example 2.
Figure 7:
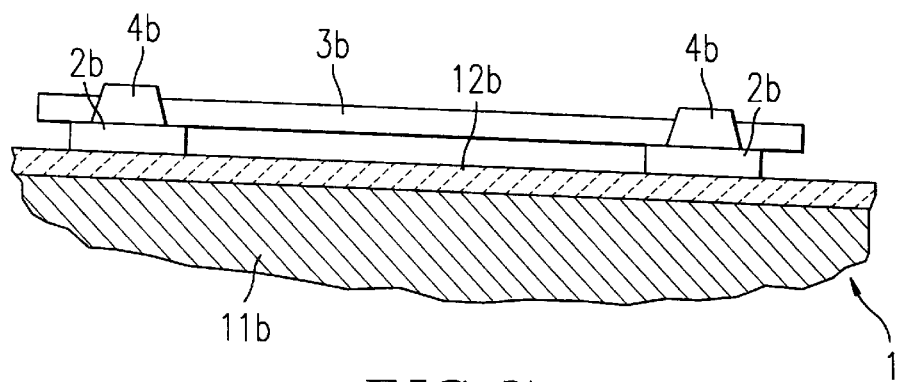
FIG. 7 is a graph showing the vertical-section of the connect with the amorphous wire and the terminal for MI sensor of example 2.
Figure 8:
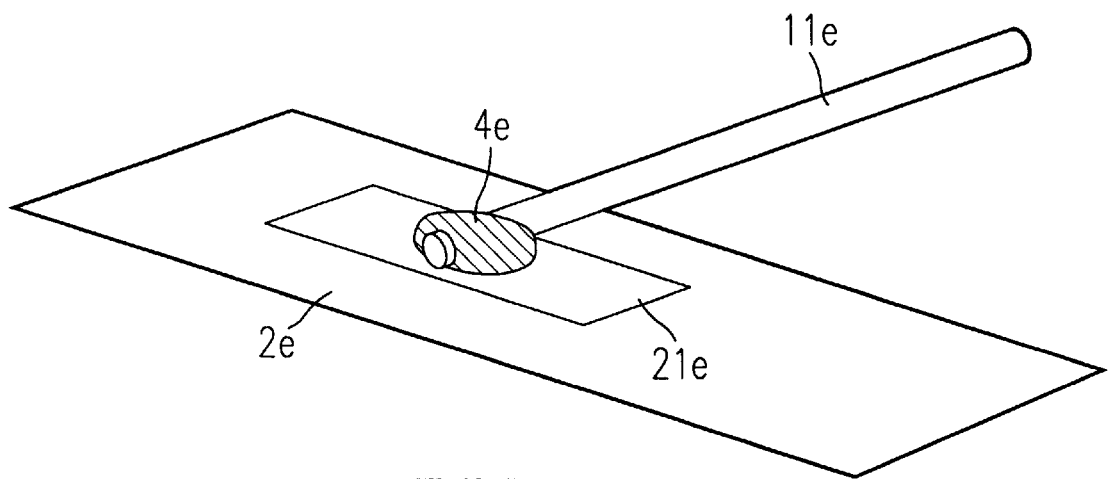
FIG. 8 is a squint graph showing the connect with the amorphous wire and the terminal soldered by conventional method.
Figure 9:
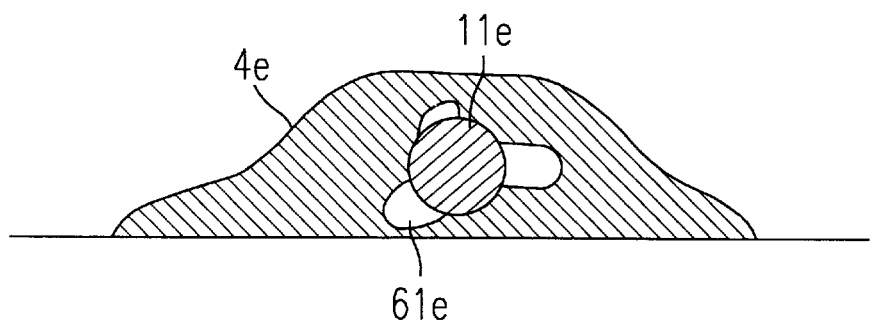
FIG. 9 is a cross-section showing how to connect with the amorphous wire and the solder when the conventional method was applied.

The following describes embodiment 2 for the present invention about the connection of the amorphous metal concretely referred to in FIG. 6 and FIG. 7.

1b is a silicon IC tip. 11b is a silicon substrate to have good electric conductivity. 12b is an insulator for passivating on the silicon substrate.

On the multi-layer insulator, the terminals were produced through a conventional photolithography process. The terminals were connected to an integrated electric circuit on the silicon substrate through opening of the insulator.

3b is the amorphous wire of which both ends were connected to the terminals using an aluminum ball (the bonding metal). The aluminum ball could get any shape such as a sheet, a semi ball and a wire and so on. That is, it was free in shape.

For bonding process, the amorphous wire was set on a pair of the terminals formed on the silicon IC tip and the aluminum ball and the ultrasonic bonding head were placed on them. Then the ultrasonic vibration supplied from the head placed on the ball made strong connections with the amorphous wire, the terminals and aluminum balls.

At this time the aluminum ball was deformed to contact the terminals and to surround the amorphous wire wholly. The connection of the amorphous wire with the terminal was covered and protected with aluminum.

What is claimed is:

1. A production method of an amorphous metal bonded part, which comprises sandwiching an amorphous metal between a terminal and a bonding metal that is softer than the amorphous metal, and applying a bonding energy to the bonding metal resulting in a bonding together of all of the terminal, the amorphous metal and the bonding metal.

2. The production method as set forth in claim 1, wherein the amorphous metal is sandwiched between the terminal and the bonding metal that is softer than the amorphous metal, and an ultrasonic bonding energy is applied to the bonding metal resulting in a bonding together of all of the terminal, the amorphous metal and the bonding metal.

3. The production method as set forth in claim 1, wherein the bonding metal possesses a thickness greater than 30 μm.

4. The production method as set forth in claim 3, wherein the amorphous metal is an amorphous wire.

5. The production method as set forth in claim 4, wherein the bonding metal is bonded to both the amorphous wire and the terminal in the vicinity of the amorphous wire.

6. The production method as set forth in claim 5, wherein the bonding metal is arranged to be on both sides of the amorphous wire, and both ends of the bonding metal are bonded to the terminal.

7. The production method as set forth in claim 6, wherein the ultrasonic bonding energy deforms the bonding metal to cover a lateral edge of the amorphous wire and the terminal.

8. The production method as set forth in claim 4, wherein the bonding is carried out using a second bonding metal, for which the amorphous wire has a greater bonding affinity than for the terminal, that lies between the amorphous wire and the terminal.

9. The production method as set forth in any one of claims 1 to 8, wherein the bonding metal is aluminum or a predominantly aluminum alloy.

10. An amorphous metal bonded part comprising an amorphous wire sandwiched between a terminal and a bonding metal, wherein one surface of the amorphous wire is bonded to the terminal and an opposite surface thereof is bonded to the bonding metal, wherein the bonding metal is aluminum or a predominantly aluminum alloy and wherein the bonding metal is bonded to the terminal in the vicinity of a bonding portion between the amorphous wire and the terminal.

11. The amorphous metal bonded part as set forth in claim 10, wherein the bonding metal is bonded to the terminal on both sides of the amorphous wire.

12. The amorphous metal bonded part as set forth in claim 10, wherein the amorphous wire possesses a surface film with superior bonding affinity to the terminal and the bonding metal than the amorphous wire alone.

13. The amorphous metal bonded part as set forth in claim 10, wherein the amorphous wire is used as a part of a magnetic impedance sensor.

14. An amorphous metal bonded part comprising:

a terminal;

a bonding metal comprising aluminum or an aluminum alloy; and an amorphous wire having opposing sides and disposed between the terminal and the bonding metal;

wherein amorphous wire is bonded to said terminal on one of said sides, the bonding metal is bonded to the amorphous wire on the other of said sides, and said bonding metal is in contact with the terminal.

* * * * *